US010499539B2

(12) United States Patent
Lu et al.

(10) Patent No.: US 10,499,539 B2
(45) Date of Patent: Dec. 3, 2019

(54) HOST COMPUTER SYSTEM AND HEAT DISSIPATION APPARATUS AND SEPARATION MECHANISM THEREOF

(71) Applicant: Wiwynn Corporation, New Taipei (TW)

(72) Inventors: Ming-Hsien Lu, New Taipei (TW); Chien-An Chen, New Taipei (TW); Pin-Jen Chen, New Taipei (TW)

(73) Assignee: Wiwynn Corporation, New Taipei (TW)

( * ) Notice: Subject to any disclaimer, the term of this patent is extended or adjusted under 35 U.S.C. 154(b) by 0 days.

(21) Appl. No.: 16/111,947

(22) Filed: Aug. 24, 2018

(65) Prior Publication Data

US 2019/0289746 A1 Sep. 19, 2019

Related U.S. Application Data

(60) Provisional application No. 62/644,988, filed on Mar. 19, 2018.

(51) Int. Cl.
*H05K 7/20* (2006.01)
*G06F 1/20* (2006.01)
*G06F 1/18* (2006.01)

(52) U.S. Cl.
CPC ......... *H05K 7/20172* (2013.01); *G06F 1/181* (2013.01); *G06F 1/183* (2013.01); *G06F 1/20* (2013.01); *G06F 2200/201* (2013.01)

(58) Field of Classification Search
CPC .................................................. H05K 7/20172
See application file for complete search history.

(56) References Cited

U.S. PATENT DOCUMENTS

| 8,243,437 | B2* | 8/2012 | Chou | G06F 1/185 361/679.31 |
| 8,363,401 | B2* | 1/2013 | Lai | H01L 23/467 165/121 |
| 9,513,675 | B2 | 12/2016 | Nicol et al. | |
| 9,820,407 | B2 | 11/2017 | Sakamoto et al. | |
| 2014/0247552 | A1* | 9/2014 | Petruzzo | G06F 1/20 361/679.51 |

FOREIGN PATENT DOCUMENTS

| CN | 101516166 A | 8/2009 |
| CN | 103959926 A | 7/2014 |
| TW | 450379 U | 8/2001 |
| TW | M351392 U | 2/2009 |

OTHER PUBLICATIONS

Office Action dated Oct. 24, 2018 in corresponding Taiwan Patent Application No. 107121042.

* cited by examiner

*Primary Examiner* — Mukundbhai G Patel
(74) *Attorney, Agent, or Firm* — Donald E. Stout; Stout, Uxa & Buyan, LLP

(57) ABSTRACT

A heat dissipation apparatus, adaptable to at least one first circuit device and at least one second circuit device, includes a chassis; and at least one separation mechanism disposed in the chassis, the first circuit device and the second circuit device being respectively disposed at two sides of the separation mechanism, the first circuit device being not aligned with the second circuit device, and the separation mechanism including a separation board.

17 Claims, 7 Drawing Sheets

15/16

HOST COMPUTER SYSTEM AND HEAT DISSIPATION APPARATUS AND SEPARATION MECHANISM THEREOF

CROSS-REFERENCE TO RELATED APPLICATIONS

This application claims priority of U.S. Provisional Application No. 62/644,988, filed on Mar. 19, 2018, the entire contents of which are herein expressly incorporated by reference.

BACKGROUND OF THE INVENTION

1. Field of the Invention

The present invention generally relates to heat dissipation, and more particularly to a heat dissipation apparatus with enhanced heat dissipation efficiency and airflow velocity.

2. Description of Related Art

High performance computing (HPC) is carried out by using clusters of processors (e.g., graphics processing units or GPUs) that can deliver higher performance than typical desktop computers in order to solve large problems in science, engineering or business. General-purpose computing on GPUs is the use of the GPU, which replaces a central processing unit (CPU), to perform computer graphics. The use of multiple GPUs can result in a pipeline of parallel processing. The HPC, however, consumes large amounts of power, which is converted into heat, management of which is a key issue for the HPC.

A computer fan is commonly used for active cooling, compared with passive cooling such as heat sink, which draws cool air into a computer case from outside, or moves air across a heat sink to cool a particular component.

In order to enhance heat dissipation in the HPC, one scheme is proposed to use more fans at both inlet and outlet. This scheme, however, requires higher cost, consumes more power and occupies more space. Furthermore, it is observed that circuitry of the HPC located at downstream of the airflow encounters turbulent air caused by and hot air generated by circuitry located at upstream, thereby decreasing airflow velocity and heat dissipation efficiency.

A need has thus arisen to propose a novel scheme that can overcome disadvantages of conventional heat dissipation schemes.

SUMMARY OF THE INVENTION

In view of the foregoing, it is an object of the embodiment of the present invention to provide a heat dissipation apparatus capable of enhancing heat dissipation efficiency and increasing airflow velocity with lower cost.

According to one embodiment, a heat dissipation apparatus, adaptable to at least one first circuit device and at least one second circuit device, includes a chassis and at least one separation mechanism. The separation mechanism is disposed in the chassis, the first circuit device and the second circuit device are respectively disposed at two sides of the separation mechanism, and the first circuit device is not aligned with the second circuit device. The separation mechanism includes a separation board.

DETAILED DESCRIPTION OF THE INVENTION

Figure 1A:
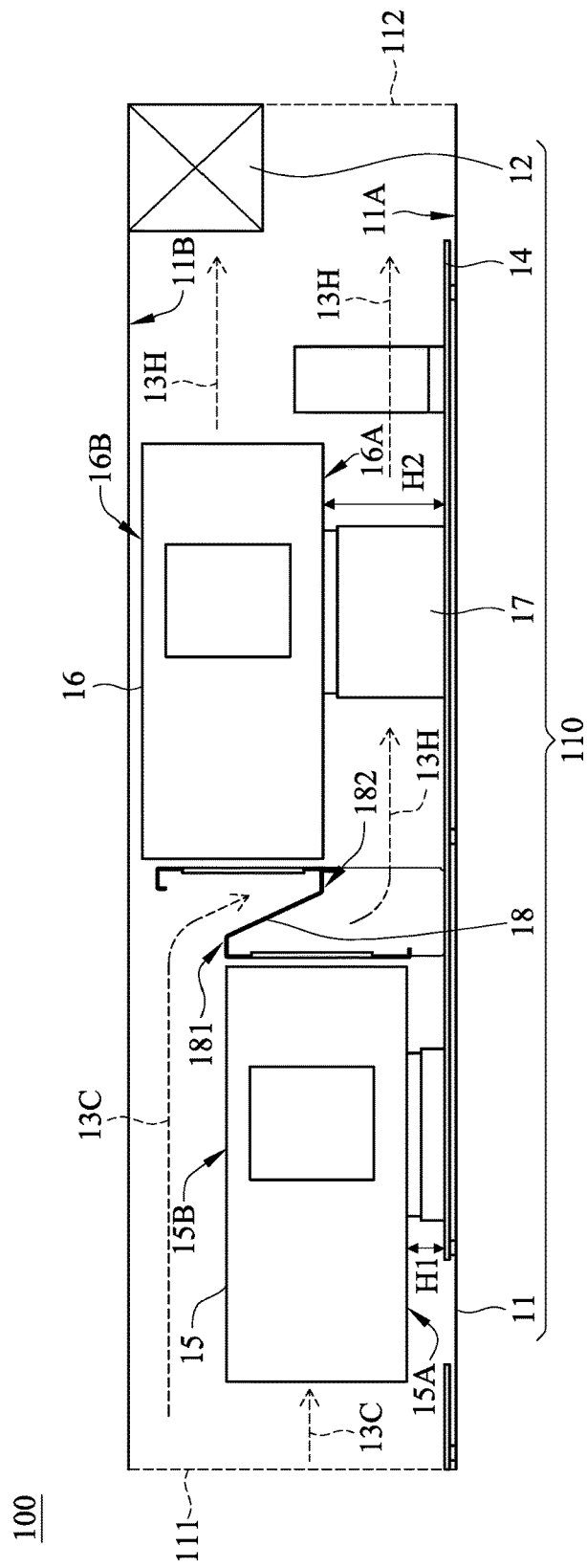
FIG. 1A shows a schematic diagram illustrating a host computer system according to one embodiment of the present invention.
Figure 1B:
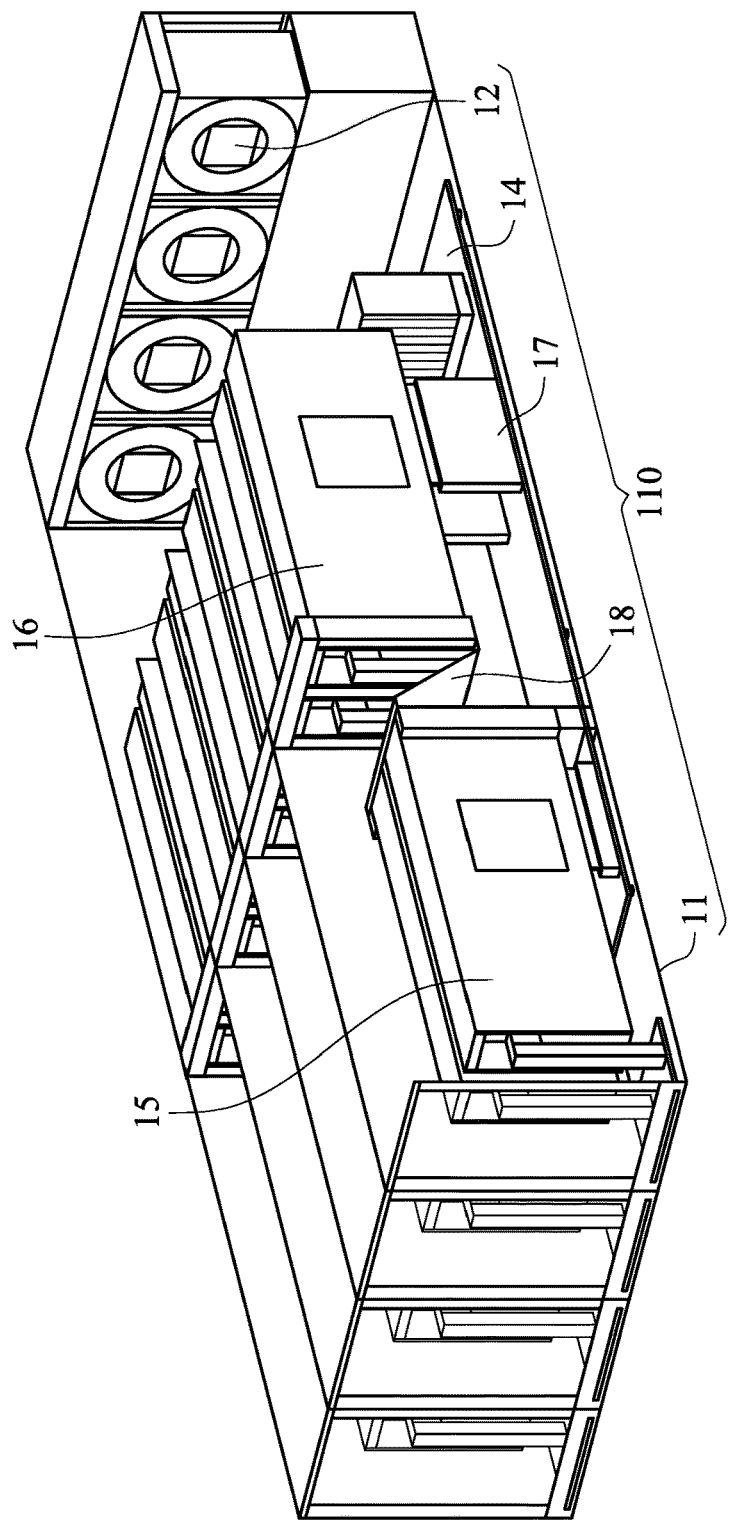
FIG. 1B shows a perspective diagram illustrating a host computer system according to one embodiment of the present invention.
Figure 1C:
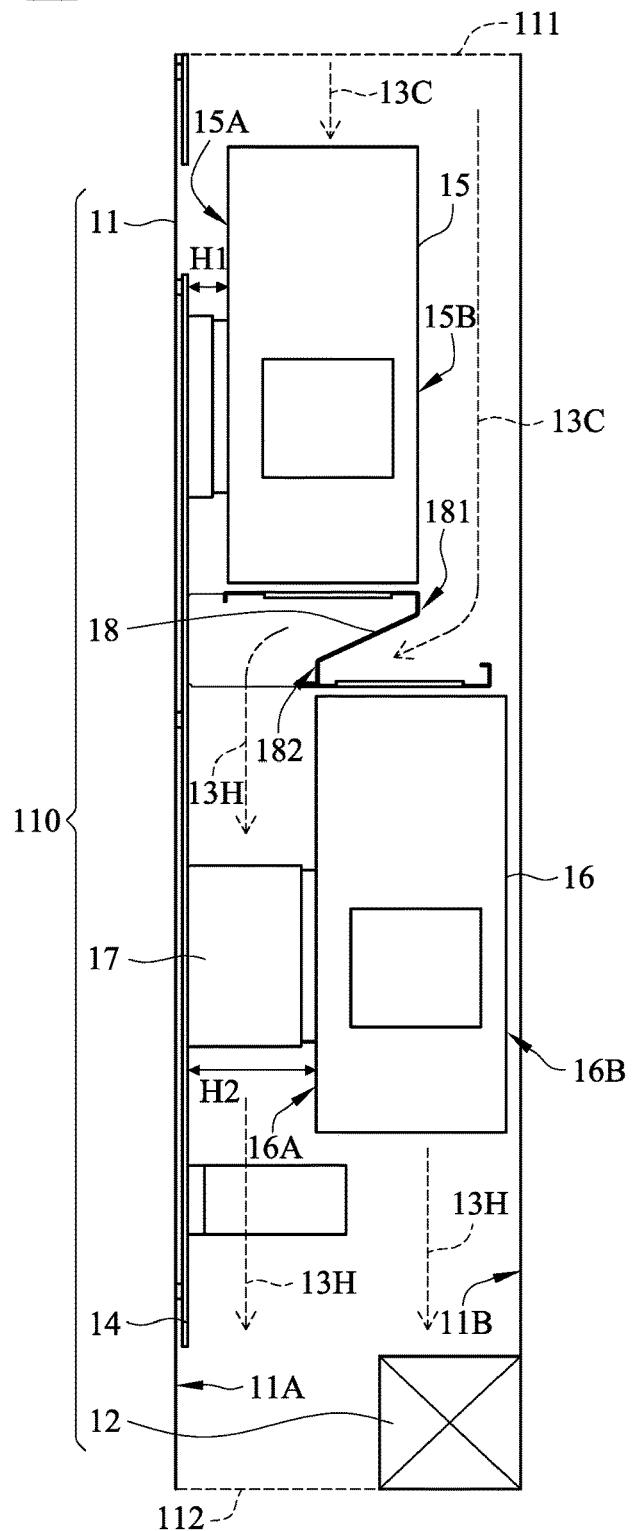
FIG. 1C shows another schematic diagram illustrating a host computer system according to one embodiment of the present invention.

FIG. 1A shows a schematic diagram illustrating a host computer system 100 according to one embodiment of the present invention, and FIG. 1B shows a perspective diagram illustrating a host computer system 100 according to one embodiment of the present invention. The host computer system 100 as exemplified in FIG. 1A and FIG. 1B is, but not necessarily, horizontally set. FIG. 1C shows another schematic diagram illustrating a host computer system 100, which is vertically set, according to one embodiment of the present invention. In the embodiment, the host computer system 100 may include a heat dissipation apparatus 110, which may include a chassis 11 with a front side 111 and a rear side 112 being opposite the front side 111. The heat dissipation apparatus 110 may include at least one fan 12 configured to draw cool air 13C into the chassis 11 via the front side 111 (acting as an inlet) and out of the chassis 11 via the rear side 112 (acting as an outlet). The fan 12 may be disposed on the rear side 112 (as exemplified in FIG. 1A), may be disposed on the front side 111, or may be disposed in the chassis 11 (e.g., disposed on a circuit card in the chassis 11). Although four fans 12 are exemplified in FIG. 1B, it is appreciated that the quantity of the fans 12 may be determined according to application requirements.

A base circuit board 14 such as a printed circuit board (PCB) is disposed in the chassis 11 and fastened to a first surface 11A (e.g., a bottom surface in FIG. 1A or a side surface in FIG. 1C) of the chassis 11. In another embodiment, the base circuit board 14 may be composed of a plurality of sub-circuit boards that are physically separated, and are either electrically connected or disconnected. The host computer system 100 of the embodiment may include at least one first circuit device 15 disposed on the base circuit board 14 and electrically connected with the base circuit board 14. The host computer system 100 of the embodiment may include at least one second circuit device 16 disposed on the base circuit board 14 and electrically connected with the base circuit board 14. As exemplified in FIG. 1A, the first circuit device 15 is near the front side 111 of the chassis 11 and the second circuit device 16 is near the rear side 112 of the chassis 11. It is appreciated that the order of placing the first circuit device 15 and the second circuit device 16 is not limited to that shown in FIG. 1A. The first circuit device 15 or the second circuit device 16 of the embodiment may be a rectangular parallelepiped and encased circuit device, which may include at least one circuit board with graphics processing units (GPUs) disposed thereon. It is appreciated that the quantity of the circuit boards may be determined according to application requirements. The encased circuit device allows cool air to enter and generated hot air to exit.

According to one aspect of the embodiment, at least one extension (or engaging) mechanism 17 may be disposed between the base circuit board 14 and the second circuit device 16 or disposed between the base circuit board 14 and the first circuit device 15, such that the second circuit device 16 or the first circuit device 15 may be electrically connected with the base circuit board 14 indirectly via the extension mechanism 17. It is appreciated that the quantity of extension mechanisms 17 may be determined according to application requirements. The embodiment is exemplified by placing the extension mechanism 17 between the base circuit board 14 and the second circuit device 16. Accordingly, a second distance H2 between a (near the base circuit board 14) first side 16A of the second circuit device 16 and the base circuit board 14 is greater than a first distance H1 between a (near the base circuit board 14) first side 15A of the first circuit device 15 and the base circuit board 14. It is appreciated that the second distance H2 mentioned above may be determined according to application requirements, for example, heights of the chassis 11, the first circuit device 15 and the second circuit device 16. Accordingly, the first side 15A of the first circuit device 15 is not aligned with the first side 16A of the second circuit device 16. The extension mechanism 17 of the embodiment may include a riser module (e.g., a printed circuit board (PCB), a flexible printed circuit (FPC) connector or other connecting components). It is noted that, in the embodiment, a second side 16B (being opposite the first side 16A) of the second circuit device 16 may be substantially near a second surface 11B (being opposite the first surface 11A) of the chassis 11, thereby sufficiently and maximally utilizing the space defined by the chassis 11.

According to another aspect of the embodiment, the heat dissipation apparatus 110 may include a separation mechanism 18 disposed between the first circuit device 15 and the second circuit device 16 (that is, the first circuit device 15 and the second circuit device 16 are respectively disposed at two sides of the separation mechanism 18), and configured to separate the cool air 13C (drawn into the chassis 11 by the fan 12) and hot air 13H generated by the first circuit device 15.

Figure 2A:
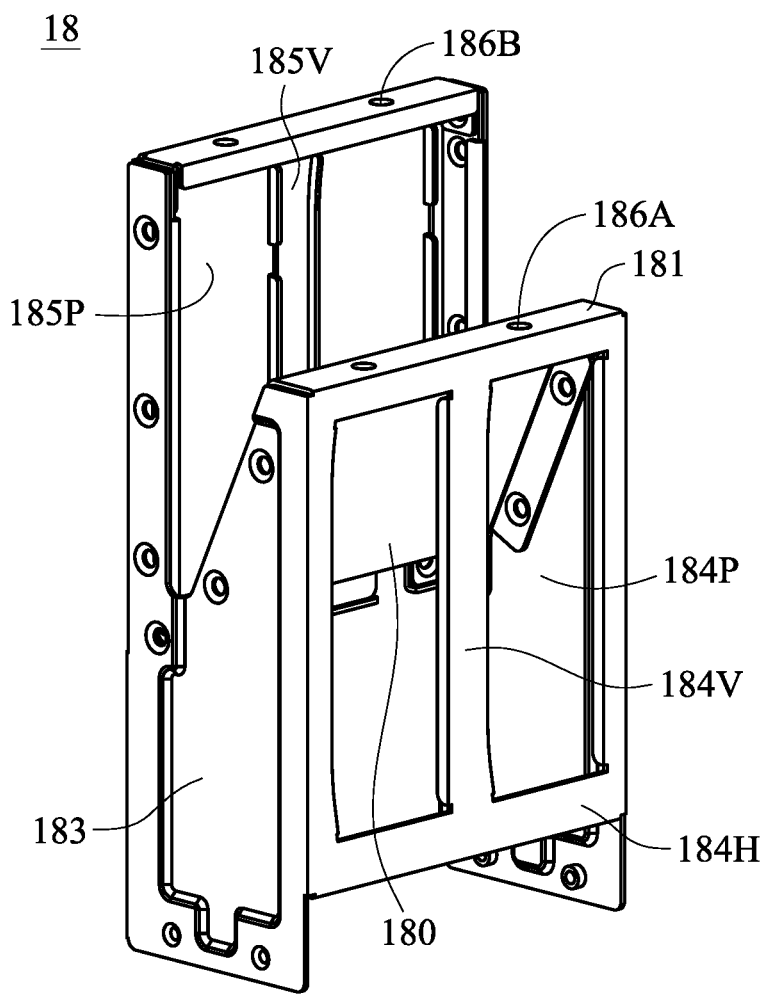
FIG. 2A and FIG. 2B show perspective diagrams illustrating the separation mechanism from different perspectives respectively according to one embodiment of the present invention.
Figure 2B:
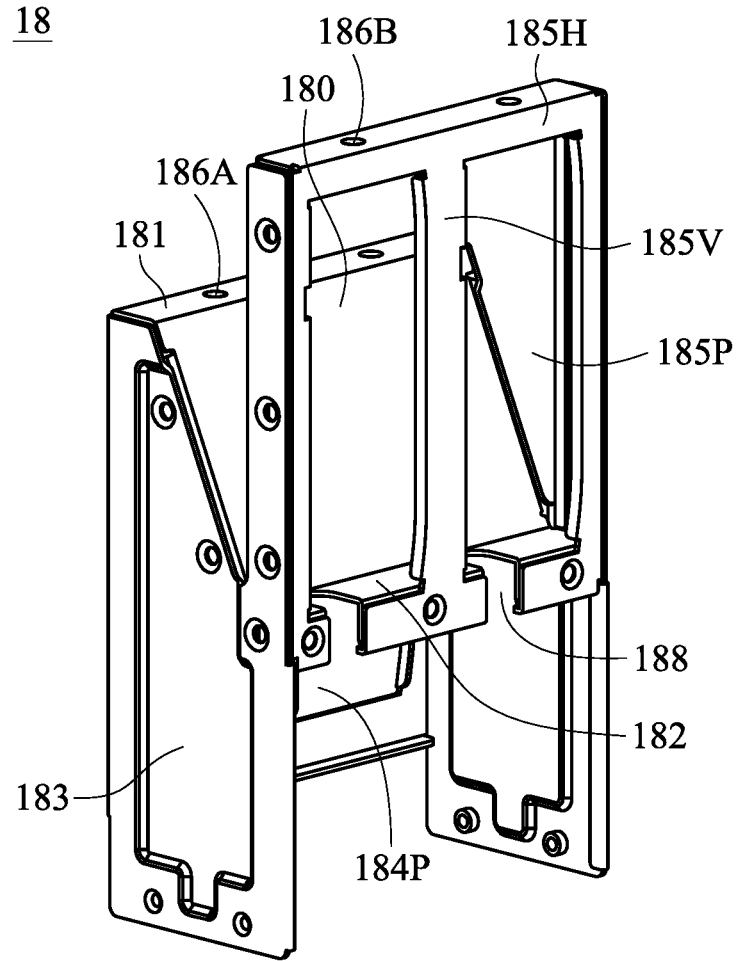

FIG. 2A and FIG. 2B show perspective diagrams illustrating the separation mechanism 18 from different perspectives respectively according to one embodiment of the present invention. In the embodiment, the separation mechanism 18 may include a slanted separation board 180 having a flat or curved surface. Specifically, the separation board 180 has a first edge 181 being disposed at or adjacent to one end (e.g., a second side 15B that is opposite the first side 15A) of the first circuit device 15, and has a second edge 182 being disposed at or adjacent to one end (e.g., the first side 16A) of the second circuit device 16. In the embodiment, the first edge 181 is more distant from the base circuit board 14 than the second edge 182. It is appreciated that the slanted angle of the separation board 180 may be determined according to application requirements, or even the separation board 180 is not slanted, that is, the separation board 180 is parallel with the base circuit board 14. The slanted angle of the separation board 180 may, for example, be adjusted according to the thickness between the first surface 11A and the second surface 11B of the chassis 11, thereby providing a passage of different size for the cool air 13C.

In the embodiment, the separation mechanism 18 may include brackets 183 fastened to the chassis 11 or the base circuit board 14, and configured to support the separation board 180. The separation mechanism 18 may include a first frame (184V and 184H) connected with the first edge 181 and extended toward the base circuit board 14 (or toward a first direction). Specifically, the first frame (184V and 184H) may include a plurality of first strips 184V connected with the first edge 181 and extended toward the base circuit board 14, and the first strips 184V are disposed at corresponding gaps of adjacent first circuit devices 15, respectively. The first frame (184V and 184H) may include a plurality of third strips 184H disposed at two ends of the first strips 184V respectively, and the third strips 184H are perpendicular to the first strips 184V. Accordingly, the hot air 13H generated by the first circuit devices 15 may be properly guided out of the first circuit devices 15 and then passing under the second circuit devices 16. Therefore, the hot air 13H generated by the first circuit devices 15 will not leak into gaps of adjacent first circuit devices 15, therefore achieving effective air flow. The first frame (184V and 184H) may have a plurality of first openings 184P with shapes corresponding to ends of the first circuit devices 15 near the first frame (184V and 184H), such that the ends of the first circuit devices 15 may be disposed at corresponding first openings 184P, respectively.

Similarly, the separation mechanism 18 may include a second frame (185V and 185H) connected with the second edge 182 and extended away from the base circuit board 14 (or toward a second direction that is opposite the first direction). Specifically, the second frame (185V and 185H) may include a plurality of second strips 185V connected with the second edge 182 and extended away from the base circuit board 14, and the second strips 185V are disposed at corresponding gaps of adjacent second circuit devices 16, respectively. The second frame (185V and 185H) may include a plurality of fourth strips 185H disposed at two ends of the second strips 185V respectively, and the fourth strips 185H are perpendicular to the second strips 185V. Accordingly, the cool air 13C drawn by the fan 12 may be properly guided into the second circuit devices 16, without leaking into gaps of adjacent second circuit devices 16, therefore achieving effective air flow. The second frame (185V and 185H) may have a plurality of second openings 185P with shapes corresponding to ends of the second circuit devices 16 near the second frame (185V and 185H), such that the ends of the second circuit devices 16 may be disposed at corresponding second openings 185P, respectively. The second strips 185V may prevent the cool air 13C from entering the gaps of adjacent second circuit devices 16.

Figure 2C:
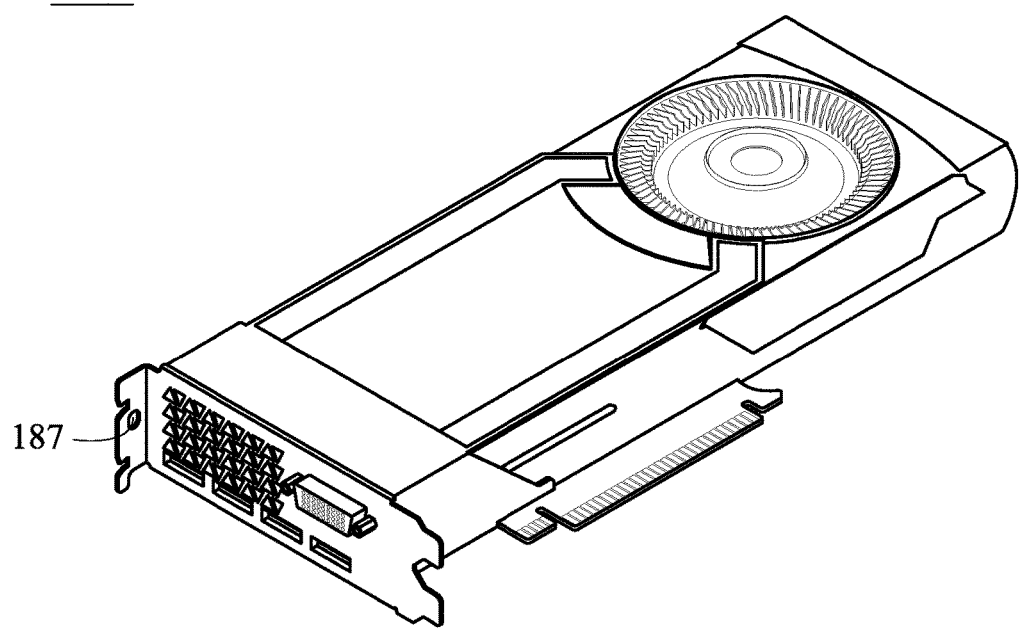
FIG. 2C shows a perspective diagram exemplifying the first circuit device or the second circuit device.

Still referring to FIG. 2A and FIG. 2B, the third strip 184H of the first frame (184V and 184H) disposed at the first edge 181 may have at least one first through-hole 186A corresponding to a fastening hole 187 of the first circuit device 15 as exemplified in FIG. 2C. Accordingly, the third strip 184H of the first frame (184V and 184H) may be fastened to the first circuit device 15. Similarly, the fourth strip 185H of the second frame (185V and 185H) disposed away from the second edge 182 may have at least one second through-hole 186B corresponding to a fastening hole 187 of the second circuit device 16 as exemplified in FIG. 2C. Accordingly, the fourth strip 185H of the second frame (185V and 185H) may be fastened to the second circuit device 16. As shown in FIG. 2B, the fourth strip 185H of the second frame (185H and 185H) disposed at the second edge 182 may have at least one break 188, for example, for routing wires of the second circuit device 16.

Figure 3:
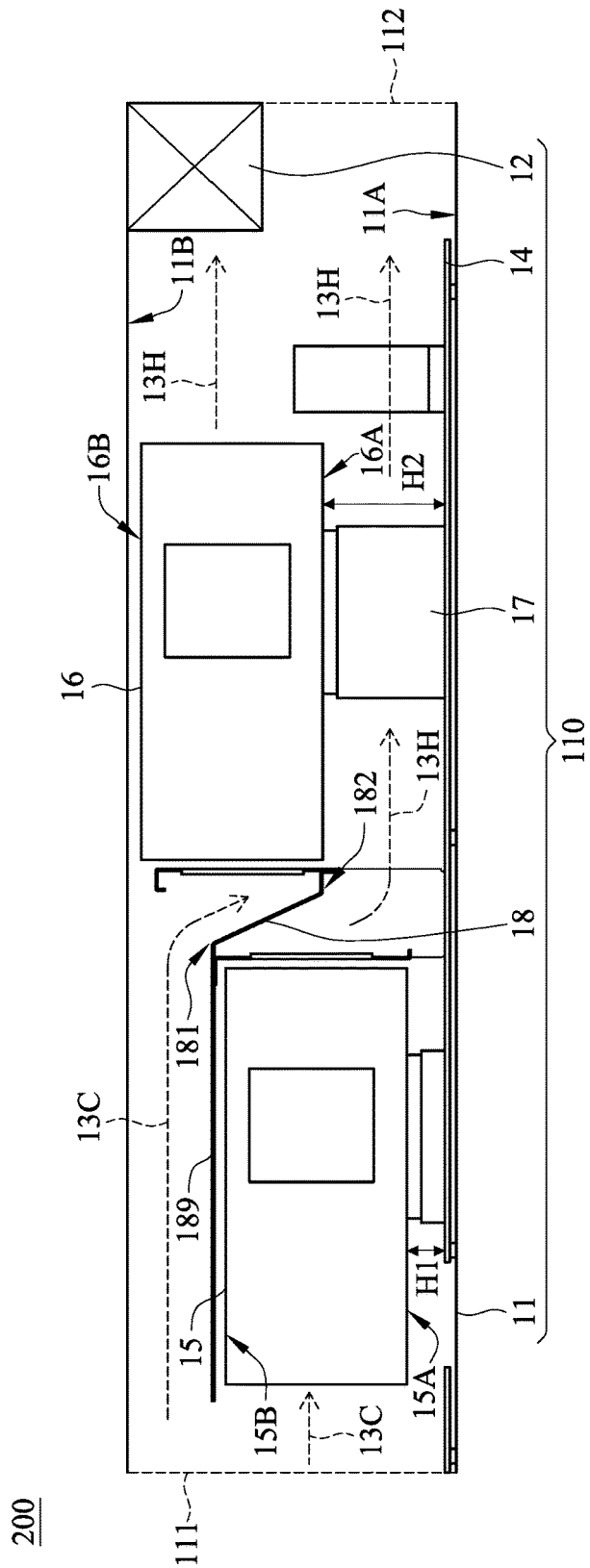
FIG. 3 shows a schematic diagram illustrating a host computer system according to another embodiment of the present invention.

FIG. 3 shows a schematic diagram illustrating a host computer system 200 according to another embodiment of the present invention. The present embodiment is similar to the embodiment of FIG. 1A with the exception that the first circuit device 15 and the second circuit device 16 are sheets of circuit boards. In the embodiment, the separation mechanism 18 may further include a blocking wall 189 extended from the first edge 181 of the separation board 180 and toward the front side 111 of the chassis 11 along the second side 15B of the first circuit device 15, and configured to guide the cool air 13C toward the rear side 112 of the chassis 11.

According to the embodiments discussed above, the second circuit device 16 may receive the cool air 13C drawn by the fan 12, instead of the hot air 13H generated by the first circuit device 15, thereby substantially enhancing heat dissipation for the second circuit device 16. Moreover, the second circuit device 16 may directly receive airflow (i.e., the cool air 13C) entering the front side 111 of the chassis 11, instead of the airflow (i.e., the hot air 13H) exiting the first circuit device 15, thereby substantially increasing airflow velocity.

Although specific embodiments have been illustrated and described, it will be appreciated by those skilled in the art that various modifications may be made without departing from the scope of the present invention, which is intended to be limited solely by the appended claims.

What is claimed is:

1. A heat dissipation apparatus, adaptable to at least one first circuit device and at least one second circuit device, the heat dissipation apparatus comprising:
   a chassis; and
   at least one separation mechanism disposed in the chassis, the at least one first circuit device and the at least one second circuit device being respectively disposed at two sides of the separation mechanism, the at least one first circuit device being not aligned with the at least one second circuit device, and the separation mechanism including a separation board;
   wherein the separation board has a first edge and a second edge, the first edge being disposed at one end of the at least one first circuit device, and the second edge being disposed at one end of the at least one second circuit device;
   wherein the separation mechanism further comprises:
   a first frame connected with the first edge, the first frame having a plurality of first openings such that an end of the at least one first circuit device is disposed at corresponding first opening; and
   a second frame connected with the second edge, the second frame having a plurality of second openings such that an end of the at least one second circuit device is disposed at corresponding second opening.

2. The apparatus of claim 1, further comprising at least one fan disposed in the chassis.

3. The apparatus of claim 1, further comprising:
   a base circuit board disposed in the chassis, the at least one first circuit device and the at least one second circuit device being disposed on the base circuit board; and
   an extension mechanism disposed between the base circuit board and the at least one second circuit device.

4. The apparatus of claim 3, wherein the extension mechanism comprises at least one riser module.

5. The apparatus of claim 1, wherein the separation board of the separation mechanism is slanted.

6. The apparatus of claim 5, wherein the first edge is more distant from the base circuit board than the second edge.

7. The apparatus of claim 1, wherein the first frame comprises a plurality of first strips connected with the first edge and extended toward a first direction, the first strips being disposed at corresponding gaps of adjacent first circuit devices respectively; and the second frame comprises a plurality of second strips connected with the second edge and extended toward a second direction that is opposite the first direction, the second strips being disposed at corresponding gaps of adjacent second circuit devices respectively.

8. The apparatus of claim 7, wherein the first frame comprises a plurality of third strips disposed at two ends of the first strips respectively, the third strips being perpendicular to the first strips; and the second frame comprises a plurality of fourth strips disposed at two ends of the second strips respectively, the fourth strips being perpendicular to the second strips.

9. A separation mechanism, adaptable to a heat dissipation apparatus with at least one first circuit device and at least one second circuit device, the separation mechanism comprising:
   a separation board disposed between the at least one first circuit device and the at least one second circuit device, the separation board having a first edge and a second edge;
   a first frame connected with the first edge and extended toward a first direction, the first frame being disposed between the separation board and the at least one first circuit device, the first frame having a plurality of first openings such that an end of the at least one first circuit device is disposed at corresponding first opening; and
   a second frame connected with the second edge and extended toward a second direction that is opposite the first direction, the second frame being disposed between the separation board and the at least one second circuit device, the second frame having a plurality of second openings such that an end of the at least one second circuit device is disposed at corresponding second opening.

10. The separation mechanism of claim 9, wherein the first frame comprises a plurality of first strips connected with the first edge and extended toward a first direction, the first strips being disposed at corresponding gaps of adjacent first circuit devices respectively; and the second frame comprises a plurality of second strips connected with the second edge and extended toward a second direction that is opposite the first direction, the second strips being disposed at corresponding gaps of adjacent second circuit devices respectively.

11. The separation mechanism of claim 10, wherein the first frame comprises a plurality of third strips disposed at two ends of the first strips respectively, the third strips being perpendicular to the first strips; and the second frame comprises a plurality of fourth strips disposed at two ends of the second strips respectively, the fourth strips being perpendicular to the second strips.

12. The separation mechanism of claim 11, wherein the third strip disposed at the first edge has at least one first through-hole corresponding to at least one fastening hole of the at least one first circuit device, the third strip accordingly being fastened to the at least one first circuit device; and the fourth strip away from the second edge has at least one second through-hole corresponding to at least one fastening hole of the at least one second circuit device, the fourth strip accordingly being fastened to the at least one second circuit device.

13. The separation mechanism of claim 11, wherein the fourth strip disposed at the second edge has at least one break for wire routing.

14. A host computer system, comprising:
a chassis;
at least one first circuit device and at least one second circuit device;
a base circuit board disposed in the chassis, the at least one first circuit device and the at least one second circuit device being disposed on the base circuit board;
at least one fan disposed in the chassis; and
at least one separation mechanism disposed in the chassis, the at least one first circuit device and the at least one second circuit device being respectively disposed at two sides of the separation mechanism, and the at least one first circuit device being not aligned with the at least one second circuit device;
wherein the separation mechanism comprises a separation board having a first edge and a second edge, the first edge being disposed at one end of the at least one first circuit device, and the second edge being disposed at one end of the at least one second circuit device;
wherein the separation mechanism further comprises:
a first frame connected with the first edge, the first frame having a plurality of first openings such that an end of the at least one first circuit device is disposed at corresponding first opening; and
a second frame connected with the second edge, the second frame having a plurality of second openings such that an end of the at least one second circuit device is disposed at corresponding second opening.

15. The system of claim 14, further comprising an extension mechanism disposed between the base circuit board and the at least one second circuit device.

16. The system of claim 14, further comprising:
a blocking wall extended from the first edge of the separation board and toward a front side of the chassis along the first circuit device.

17. The system of claim 14, wherein a second distance between the base circuit board and a side of the at least one second circuit device near the base circuit board is greater than a first distance between the base circuit board and a side of the at least one first circuit device near the base circuit board.

* * * * *